United States Patent [19]

Seong

[11] Patent Number: 5,242,311
[45] Date of Patent: Sep. 7, 1993

[54] ELECTRICAL CONNECTOR HEADER WITH SLIP-OFF POSITIONING COVER AND METHOD OF USING SAME

[75] Inventor: Au Y. C. Seong, Singapore, Singapore

[73] Assignee: Molex Incorporated, Lisle, Ill.

[21] Appl. No.: 17,557

[22] Filed: Feb. 16, 1993

[51] Int. Cl.$^5$ .......................................... H01R 13/44
[52] U.S. Cl. ...................................... 439/135; 439/83; 439/148; 439/149; 439/367; 439/893
[58] Field of Search .................. 439/79, 83, 135, 139, 439/148, 149, 367, 480, 521, 892, 893

[56] References Cited

U.S. PATENT DOCUMENTS

| | | | |
|---|---|---|---|
| 3,545,606 | 12/1970 | Bennett et al. | 206/56 |
| 4,061,405 | 12/1977 | Minter | 339/17 M |
| 4,396,245 | 8/1983 | Lane | 439/148 |
| 4,475,284 | 10/1984 | Johnson | 29/739 |
| 4,744,143 | 5/1988 | Sadigh-Behzadi | 439/135 |
| 4,819,326 | 4/1989 | Stannek | 29/837 |
| 4,871,320 | 10/1989 | Mouissie | 439/78 |
| 5,026,295 | 6/1991 | Fong et al. | 439/149 |
| 5,055,971 | 10/1991 | Fudala et al. | 361/400 |
| 5,106,313 | 4/1992 | Lwee et al. | 439/149 |
| 5,169,347 | 12/1992 | Sang | 439/885 |

Primary Examiner—Paula A. Bradley
Attorney, Agent, or Firm—Charles S. Cohen

[57] ABSTRACT

A method and system are provided for mounting a header assembly to a mounting surface of an electrical apparatus through the use of a vacuum-suction nozzle. The header assembly includes a dielectric housing adapted to be positioned adjacent the mounting surface. The assembly includes a plurality of terminals mounted in the housing. The terminals have tail portions for interconnection to circuitry of the electrical apparatus and pin portions projecting from the housing. A slip-off cover has a plurality of pin-receiving passages for receiving free ends of the pin portions of at least some of the terminals. The pin portions are interference-fit in the passages to allow the cover and the header assembly to be mounted together to the electrical apparatus and to allow the cover to be slid off the terminals after the tail portions of the terminals are interconnected to the circuitry of the electrical apparatus. The cover has a smooth top surface area of a size sufficient for engagement by the vacuum-suction nozzle for conjoint manipulation and positioning of the header assembly and the cover.

7 Claims, 2 Drawing Sheets

ELECTRICAL CONNECTOR HEADER WITH SLIP-OFF POSITIONING COVER AND METHOD OF USING SAME

FIELD OF THE INVENTION

This invention generally relates to the art of electrical connectors and, particularly, to a header which includes a positioning cover that is slipped or slid off of terminal pins of the header after the pins are interconnected to an electrical apparatus, such as after the pins are soldered to a printed circuit board.

BACKGROUND OF THE INVENTION

With the continuing trend toward compact electronic apparatus, there is an ever-increasing demand for miniaturized interconnection systems between the electronic components of the apparatus. An example is in computer apparatus wherein there is a constant demand to reduce the thickness or height parameters of the electronic components. With the components mounted on a printed circuit board, the thickness or height parameters relate to the distance above the board in which desired interconnections are made and which constantly are being miniaturized.

One approach to such miniaturization is to eliminate bulky electrical connector housings and, instead, to use relatively thin headers or header blocks for locating and/or inserting terminal pins into appropriate holes in the printed circuit board. The pins then are soldered to circuit traces on the board or in the holes, and a complementary connector assembly can be mounted directly to the pins projecting upwardly from the then header block.

Problems continue to be encountered in handling such header assemblies for mounting to a mounting surface of an electrical apparatus, such as positioning the header assembly on the printed circuit board. As is known, a soldering reflow vessel often is used in automatically mounting electrical connectors to printed circuit boards. It has become expedient to use a vacuum-suction nozzle for handling the electrical connector during the soldering reflow process. Specifically, an electrical connector is secured by a vacuum-suction nozzle, and the electrical connector is manipulated in position and brought to a selected position on the printed circuit board by the vacuum-suction nozzle. The electrical connector then is released from the vacuum-suction nozzle by stopping application of negative pressure thereto. After all of the desired components are mounted to the printed circuit board, gas is released inside the soldering reflow vessel or infrared rays are radiated therein until the solder applied to selected conductors on the printed circuit board has been melted, thereby soldering the selected conductors to solder tails of the electrical connector.

Such a system involving the use of a vacuum-suction nozzle is quite effective if the electrical connector has a smooth or flat top surface for securement by the vacuum-suction nozzle as described above. However, header assemblies, as described above, have the terminal pins projecting upwardly of the header block and, therefore, there is no smooth surface for direct engagement by the vacuum-suction nozzle.

Consequently, it has been proposed to employ a separate cover which presents a smooth top surface for engagement by the vacuum-suction nozzle, the cover being releasably interengaged with the header assembly. After the header assembly is brought to a selected position on the printed circuit board by the vacuum-suction nozzle, and after the soldering reflow process, the separate cover is removed and the header assembly is left interconnected to the printed circuit board by the soldering of the terminal pins to the selected conductors on the printed circuit board. This approach is shown in co-pending application, Ser. No. 07/982,210, filed on Nov. 25, 1992, which is assigned to the assignee of this invention. That disclosure shows complementary releasably retention means, such as recesses, on the side walls of the insulative header block for engagement by hook portions of cantilevered arms projecting from the separate cover. The cover has a smooth top surface for engagement by a vacuum-suction nozzle. This allows the cover to be removed from the header assembly after the soldering reflow process by disengaging the cantilevered arms. While this system has proven effective for its intended purpose, the additional releasable arms add to the overall dimensions of the interconnection area on the printed circuit board and, in essence, take up valuable "real-estate" on the board surface, at least during the manufacturing process. In other words, the cantilevered arms could interfere with electrical components positioned on the board.

The present invention is directed to an improved system similar to that disclosed in the aforesaid copending application, by providing a sliding interference-fit between the separate cover and the terminal pins totally within the bounds of the header block, the separate cover still being readily removable from the header assembly after the assembly is mounted to the printed circuit board, and with the separate cover affording a smooth surface for engagement by a vacuum-suction nozzle.

SUMMARY OF THE INVENTION

An object, therefore, of the invention is to provide a new and improved system and method for positioning or mounting a header assembly on a mounting surface of an electrical apparatus, such as a printed circuit board, through the use of a vacuum-suction nozzle.

In the exemplary embodiment of the invention, a header assembly is provided with a dielectric housing, and a plurality of terminals are mounted on the housing, with the terminals having tail portions exposed at one side of the housing and pin portions projecting from an opposite side of the housing. A slip-off cover is provided with a plurality of pin-receiving passages, the cover having a smooth top surface area of a size sufficient for engagement by a vacuum-suction nozzle. The cover is slipped onto free ends of the pin portions of the terminals with an interference-fit between the pin portions and the pin-receiving passages in the cover. The smooth top surface area of the cover is engaged with the vacuum-suction nozzle, and the header assembly and the cover together are positioned on the mounting surface of the electrical apparatus. The tail portions of the terminals are interconnected to circuitry on the electrical apparatus, and the cover then can be slid off of the pin portions of the terminals.

The invention also contemplates that the slip-off cover can be provided with peripheral dimensions small enough to be contained within the peripheral bounds of the header assembly.

The invention also contemplates that the thickness of the cover could be sufficient so that the cover is relatively stiff to allow the vacuum-suction nozzle to lift the cover without requiring the vacuum-suction nozzle engaging the entire top surface of the cover. For instance, the header assembly may have a considerable length. However, the invention contemplates that the length of the interference-fit between the pin portions of the terminals and the pin-receiving passages in the cover be less than the thickness of the cover to reduce the amount of force required to slide the cover off the free ends of the pin portions of the terminals.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 2:
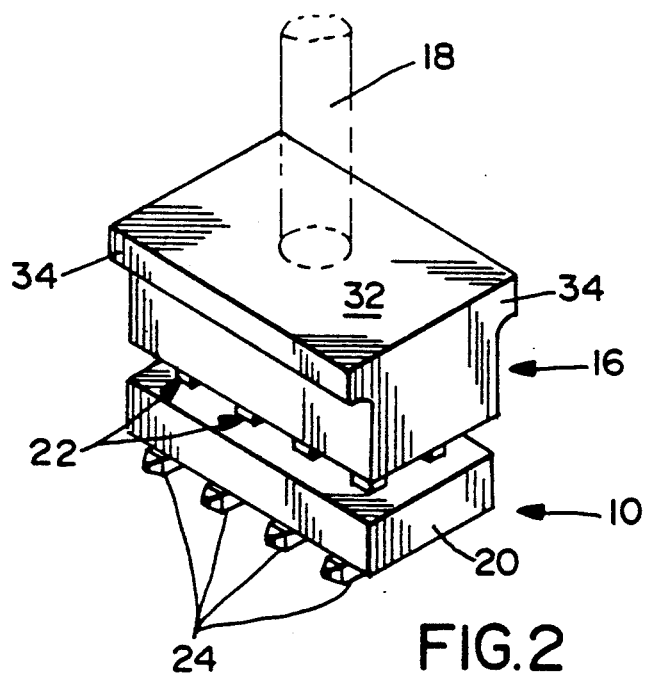
FIG. 2 is a view similar to that of FIG. 1, with the cover slipped onto the terminal pins of the assembly, and showing a vacuum-suction nozzle, in phantom, in engagement with the cover.

Referring to the drawings in greater detail, the invention involves a method and system for mounting a header assembly, generally designated 10, to a mounting surface 12 (FIG. 4) of an electrical apparatus, such as a printed circuit board 14 (FIG. 4), through the use of a vacuum-suction nozzle engageable with a slip-off cover, generally designated 16. The nozzle is shown in phantom in FIG. 2, such as at 18.

Figure 1:
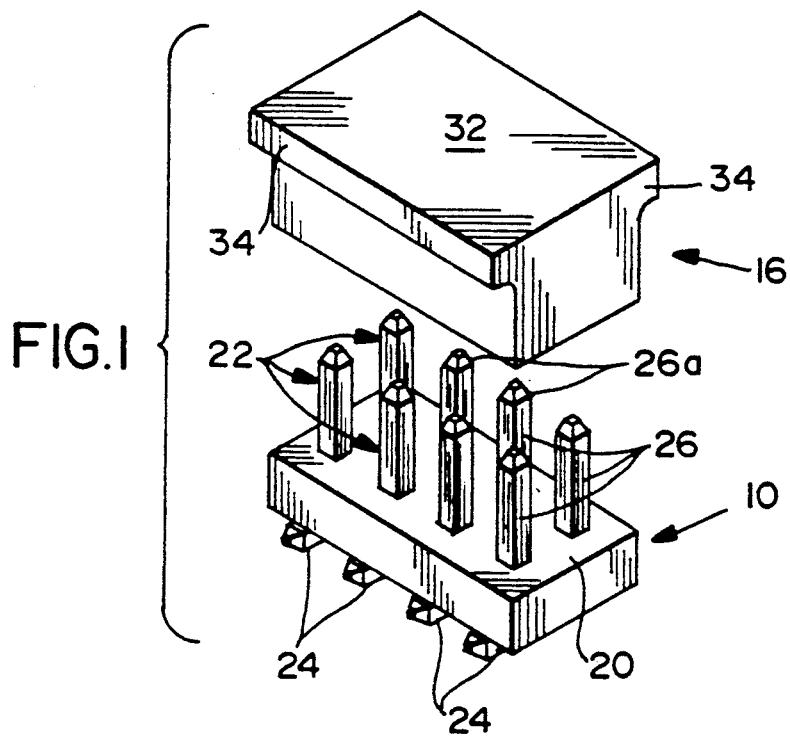
FIG. 1 is a perspective view a header assembly and a slip-off cover according to the invention, with the cover removed from the assembly.

Header assembly 10 includes a dielectric housing or header block 20 adapted to be positioned adjacent the mounting surface of the printed circuit board. A plurality of terminals, generally designated 22, are mounted in header block 20. The terminals include tail portions 24 exposed at the bottom of the header block and pin portions 26 projecting upwardly from the top of the header block. The tail portions of the terminals are at right angles to the pin portions, whereby the tail portions are adapted for surface mount interconnection to contact pads or circuit traces 28 (FIG. 4) on mounting surface 12 of printed circuit board 14, as by soldering. Pin portions 26 have free ends 26a (FIG. 1) onto which slip-off cover 16 is slid, as described below. In the alternative, the tail portions could be linear extensions of pin portions 26 as is known for through-hole mounting.

Figure 5:
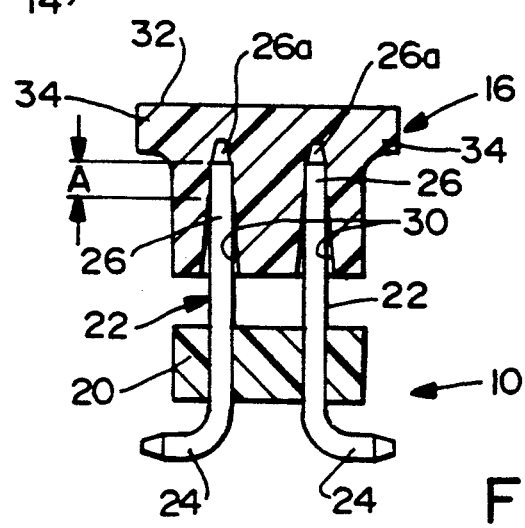
FIG. 5 is a vertical section taken generally along line 5—5 of FIG. 3, with the header block in elevation.

Slip-off cover 16 has a plurality of pin-receiving passages 30 which are best shown in FIG. 5. The passages are adapted for receiving pin portions 26 of terminals 22 by sliding free ends 26a of the pin portions into the passages. The pin portions are interference-fit in the passages to allow the cover and the header assembly to be mounted together onto printed circuit board 14 and to allow the cover to be slid off the terminals after tail portion 24 of the terminals are soldered to the printed circuit board. Cover 16 has a smooth top surface 32 for engagement by vacuum-suction nozzle 18. Although the entire top surface of cover 16 is shown herein as being flat or smooth, it should be understood that other configurations are contemplated as long as there is a smooth top surface area of a size sufficient for engagement by the vacuum-suction nozzle. Lastly, cover 16 includes outwardly projecting side flanges 34 for manual grasping and slipping the cover off of the terminal pins of the header assembly, if desired.

The system of the invention, as described above, contemplates a method of positioning header assembly 10 on mounting surface 12 of printed circuit board 14 by the combined use of slip-off cover 16 and vacuum-suction nozzle 18. More particularly, the slip-off cover is slid onto free ends 26a of pin portions 26 of terminals 22, with an interference fit between the pin portions and pin-receiving passages 30 in the cover. This is shown by comparing FIGS. 1 and 2.

Vacuum-suction nozzle 18 (FIG. 2) engages the smooth top surface 32 of cover 16, and the header assembly and the cover are mounted together on mounting surface 12 of printed circuit board 14 with the aid of the vacuum-suction nozzle. Tail portions 24 of terminals 22 then are interconnected to the circuitry on the printed circuit board, such as by soldering the tail portions to circuit traces 28 on mounting surface 12 as shown in FIG. 4.

With the header assembly now being fully coupled to the printed circuit board 14, slip-off cover 16 then can be slid off the pin portions of the terminals by manually grasping flanges 34 of the cover.

Figure 3:
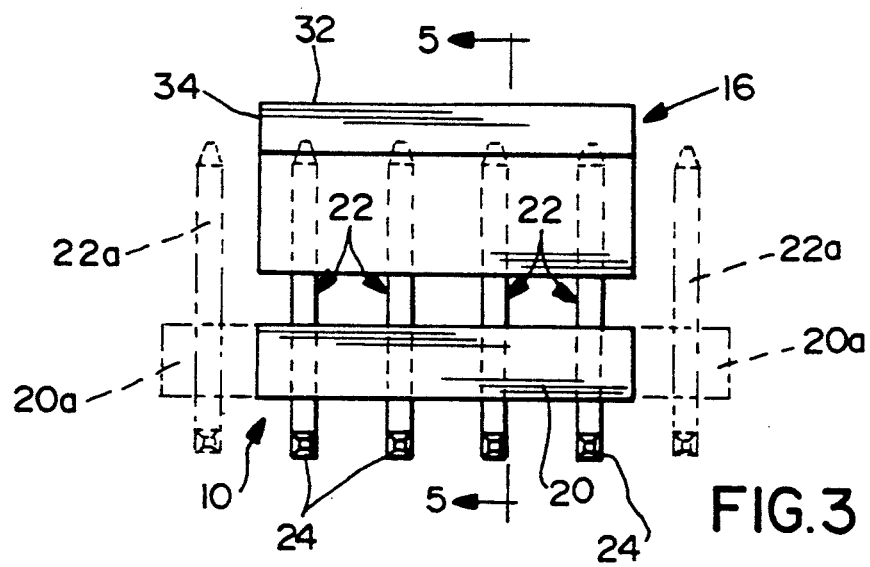
FIG. 3 is a front elevational view of the header assembly and cover as viewed in FIG. 2, with the header assembly being shown, in phantom, capable of being enlarged.

FIG. 3 shows, in phantom, that header assembly 10 can be larger or longer than cover 16 and still effect the system and method of the invention. As shown, header block 20 can be elongated at either end, as shown in phantom at 20a, and additional terminals can be located on the header block outside the bounds of cover 16, as indicated in phantom at 22a. The cover only needs to be of a sufficient size to establish a sufficient interference-fit with a sufficient number of terminals to enable the cover to be effective for manipulating and positioning the header assembly onto the printed circuit board with the aid of the vacuum-suction nozzle. As a result, only one size cover 16 is required for a variety of headers having different pin counts.

Figure 4:
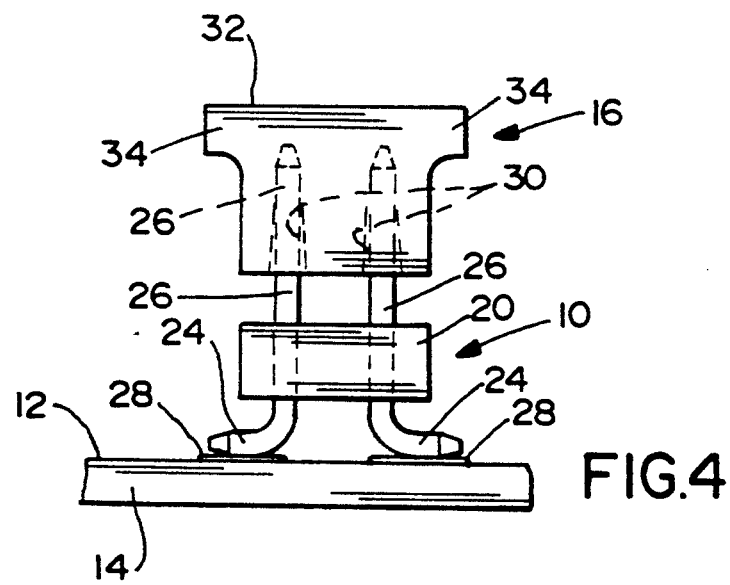
FIG. 4 is an end elevational view of the header assembly and cover as viewed in FIG. 2 positioned on a printed circuit board.

FIGS. 3 and 4 show a feature of the invention wherein slip-off cover 16, in at least the lower area thereof adjacent header block 20, is provided with peripheral dimensions (i.e., its length and width) small enough to be contained within the peripheral bounds of the header assembly (i.e., its length and width). As stated in the "Background" above, the prior system which use the aid of vacuum-suction nozzle used latch arms interconnecting the cover and the header block. These latching arms were located outside the peripheral bounds of the header block and, thus, in some applications could interfere with other electrical components to be mounted on the printed circuit board. It should be noted that flanges 34 of slip-off cover 16 are located at the top of the cover to minimize interference with any adjacent electronic components.

Lastly, FIG. 5 shows a feature of the invention which reduces the amount of force required to slide cover 16 off the pin portions of the terminals. More particularly, it should be understood that cover 16 must be of a sufficient thickness so that the cover is relatively stiff to allow the vacuum-suction nozzle to act on the cover without the nozzle engaging the entire top surface of the cover and/or without bowing the cover. The invention contemplates that the length of the interference-fit between the pin portions 26 of terminals 22 and pin-receiving passages 30 of cover 16 be less than the thickness of the cover to reduce the amount of force required to slide the cover off the pin portions. This is shown by the double-headed dimensional arrow "A" in FIG. 5. It can be seen that pin-receiving passages 30 actually engage pin portions 26 only in the area indicated by arrow "A", the remaining internal lengths of the passages being enlarged beyond or inwardly of these interference-fit areas "A". It is also contemplated that it is only necessary for some, such as half, of the pin-receiving passages 30 actually engage pin portions 26.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A method of positioning a header assembly on a mounting surface of an electrical apparatus through the use of a vacuum-suction nozzle, comprising the steps of:
   providing a header assembly with a dielectrical housing and a plurality of terminals mounted on the housing, with the terminals having tail portions exposed at an upper side of the housing and pin portions projecting from another side of the housing;
   providing a slip-off cover with a plurality of pin-receiving passages, the cover having a smooth top surface area of a size sufficient for engagement by the vacuum-suction nozzle;
   sliding the cover onto free-ends of the at least some of pin portions of the terminals with an interference-fit between the pin portions and the pin-receiving passages in the cover;
   engaging the smooth top surface area of the cover with the vacuum-suction nozzle;
   positioning the header assembly and the cover together on the mounting surface of the electrical apparatus;
   soldering the tail portions of the terminals to circuitry on the electrical apparatus; and
   sliding the cover off the free ends of the pin portions of the terminals.

2. The method of claim 1 wherein said slip-off cover, at least in one area thereof adjacent the housing of the header assembly, is provided with peripheral dimensions small enough to be contained within the peripheral bounds of the header assembly.

3. The method of claim 1 wherein said slip-off cover is provided with a given thickness, and including providing an interference-fit between the pin portions of the terminals and the pin-receiving passages of a length less than the thickness of the cover thereby reducing the amount of force required to slide the cover off the pin portions of the terminals.

4. A system for mounting a header assembly to a mounting surface of an electrical apparatus through the use of a vacuum-suction nozzle, comprising:
   a header assembly including a dielectric housing adapted to be positioned adjacent said mounting surface, and a plurality of terminals mounted on the housing, the terminals including tail portions for interconnection to circuitry of the electrical apparatus and pin portions projecting upward from the housing; and
   a slip-off cover having a plurality of pin-receiving passages for receiving free ends of the pin portions of at least some of the terminals, the pin portions being interference-fit in the passages to allow the cover and the header assembly to be mounted to the electrical apparatus and to allow the cover to be slid off the terminals after the tail portions of the terminals are interconnected to the circuitry of the electrical apparatus, and the cover having a smooth top surface area of a size sufficient for engagement by the vacuum-suction nozzle for manipulation and positioning of the header assembly and the cover.

5. The system of claim 4 wherein said cover has a given thickness, and the length of the interference-fit between the pin portions of the terminals and the pin-receiving passages is less than the thickness of the cover to reduce the amount of force required to slide the cover off the pin portions of the terminals.

6. The system of claim 4 wherein said slip-off cover, at least in an area thereof adjacent the housing of the header assembly, has peripheral dimensions no greater than the peripheral bounds of the dielectric housing of the header assembly.

7. The system of claim 4 wherein said slip-off cover includes outwardly projecting flange means adjacent the smooth top surface area thereof to allow manual sliding of the cover off the terminals.

* * * * *